United States Patent
Ito

(10) Patent No.: US 9,263,656 B2
(45) Date of Patent: Feb. 16, 2016

(54) SEMICONDUCTOR LIGHT-EMITTING DEVICE HAVING DOUBLE ENCAPSULATING STRUCTURE

(71) Applicant: Stanley Electric Co., Ltd., Tokyo (JP)

(72) Inventor: Yuichi Ito, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/626,997

(22) Filed: Feb. 20, 2015

(65) Prior Publication Data

US 2015/0270462 A1   Sep. 24, 2015

(30) Foreign Application Priority Data

Mar. 24, 2014  (JP) ................. 2014-060164

(51) Int. Cl.
  *H01L 33/00* (2010.01)
  *H01L 31/0203* (2014.01)
  *H01L 23/495* (2006.01)
  *H01L 23/48* (2006.01)
  *H01L 23/52* (2006.01)
  *H01L 23/29* (2006.01)
  (Continued)

(52) U.S. Cl.
  CPC .............. *H01L 33/62* (2013.01); *H01L 33/486* (2013.01); *H01L 33/56* (2013.01); *H01L 23/3135* (2013.01); *H01L 27/14618* (2013.01); *H01L 31/0203* (2013.01); *H01L 33/38* (2013.01); *H01L 33/54* (2013.01)

(58) Field of Classification Search
  CPC ....... H01L 33/486; H01L 33/32; H01L 33/38; H01L 33/54; H01L 33/56; H01L 33/62; H01L 2224/48091; H01L 2224/48247; H01L 2224/16; H01L 25/0753; H01L 31/0203; H01L 27/14618; H01L 2924/01079; H01L 2924/01078; H01L 2924/14; H01L 2924/01029; H01L 2924/01013; H01L 2924/15311; H01L 23/293; H01L 23/3135
  USPC ........... 257/98, 100, 433, 676, 678, 690, 692, 257/735, 787, 788, 790
  See application file for complete search history.

(56) References Cited

U.S. PATENT DOCUMENTS 4,843,280 A * 6/1989 Lumbard .................. G09F 9/33
257/E25.02
8,115,106 B2  2/2012 Tanaka et al.
(Continued)

FOREIGN PATENT DOCUMENTS

JP       2003-282952 A    10/2003

*Primary Examiner* — Teresa M Arroyo
(74) *Attorney, Agent, or Firm* — Kenealy Vaidya LLP

(57) ABSTRACT

A semiconductor light-emitting device having favorable optical characteristics can include a first conductor pattern having a die-bonding pad and a second conductor pattern having a wire bonding pad, which are formed on a circuit board. The semiconductor light-emitting device can also include a semiconductor light-emitting chip mounted on the die-bonding pad, a first encapsulating material, which can include a wavelength converting material to wavelength-convert light emitted from the chip and can cover the chip in a substantially fair dome shape on the circuit board, and a second encapsulating resin to cover the first encapsulating material, which can transmit light emitted from the first encapsulating material. Thus, a semiconductor light-emitting device is provided, which can emit a mixture light having various color tones and favorable optical characteristics and which can be used to illuminate goods laid out in a narrow show window, a vending machine, and the like.

13 Claims, 10 Drawing Sheets

(51) Int. Cl.
  *H01L 33/62* (2010.01)
  *H01L 33/56* (2010.01)
  *H01L 33/48* (2010.01)
  *H01L 33/38* (2010.01)
  *H01L 33/54* (2010.01)
  *H01L 23/31* (2006.01)
  *H01L 27/146* (2006.01)

(56) References Cited

U.S. PATENT DOCUMENTS

2009/0145647 A1* 6/2009 Tanaka .................. H01L 33/62
 174/260
2009/0230421 A1* 9/2009 Su ......................... H01L 33/62
 257/99

* cited by examiner

FIG. 3 First Comparative Embodiment
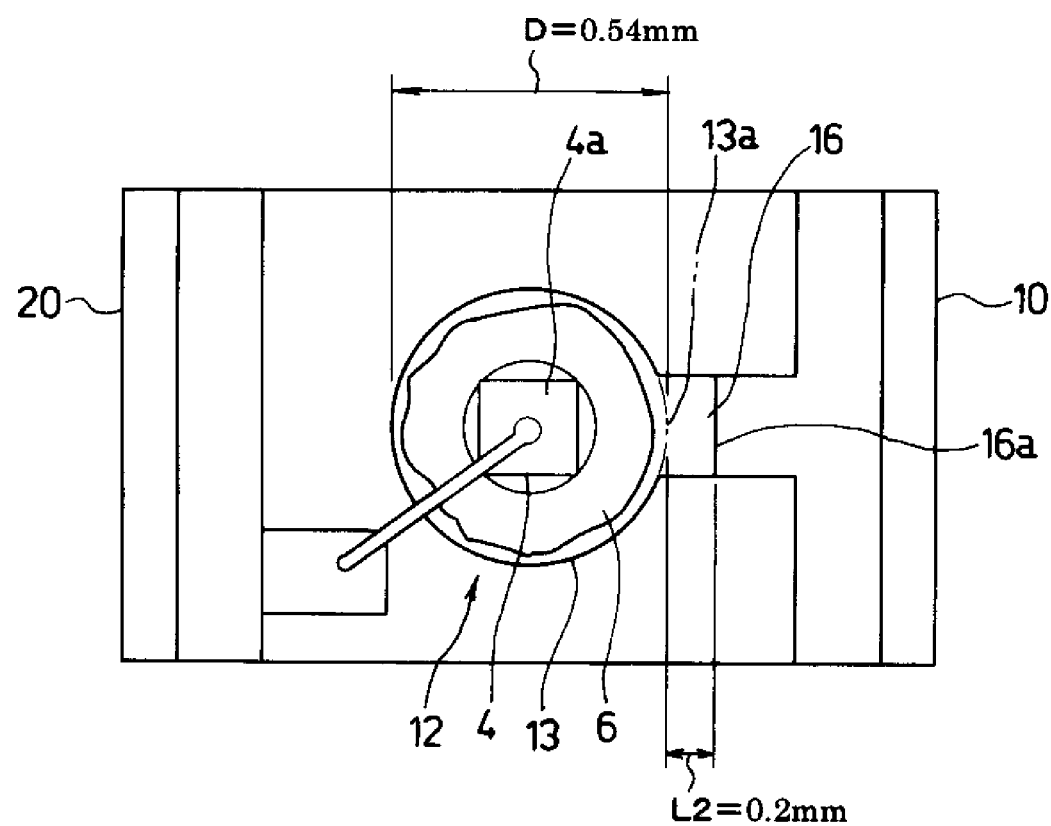

FIG. 4a  First Comparative Embodiment
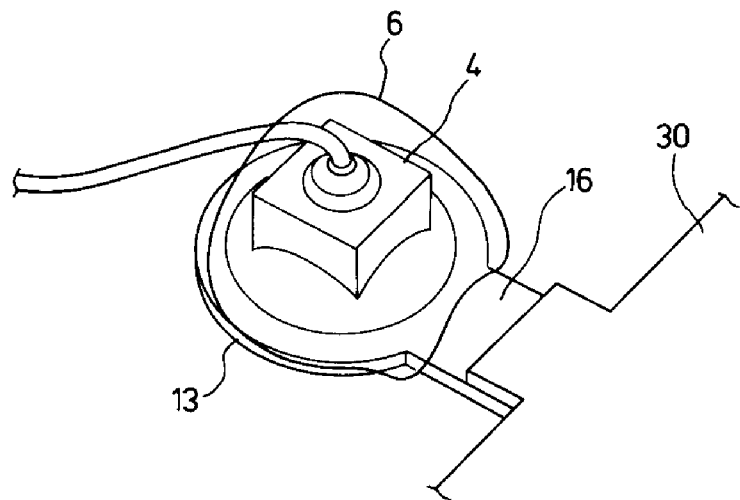
FIG. 4b  First Comparative Embodiment
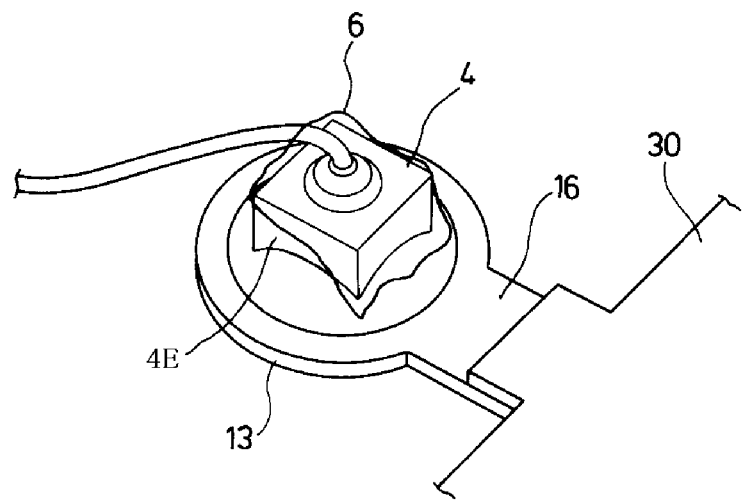

FIG. 6a
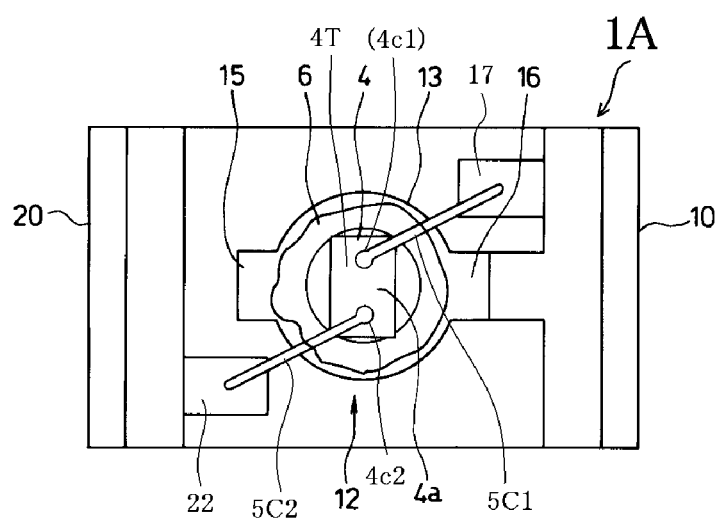
FIG. 6b  Second Comparative Embodiment
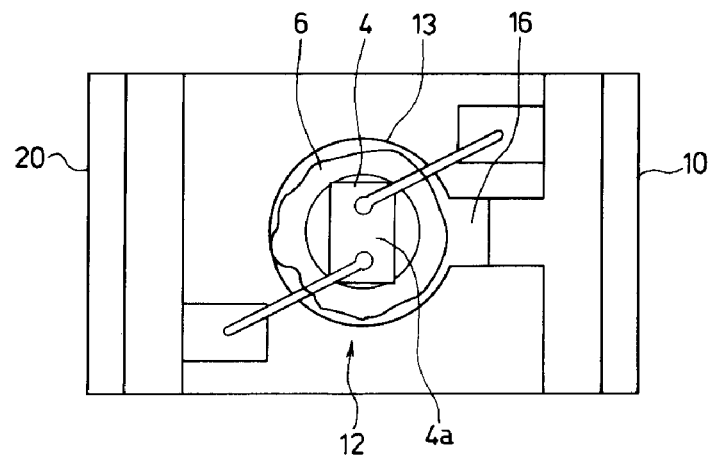

FIG. 7a  Second Comparament Embodiment
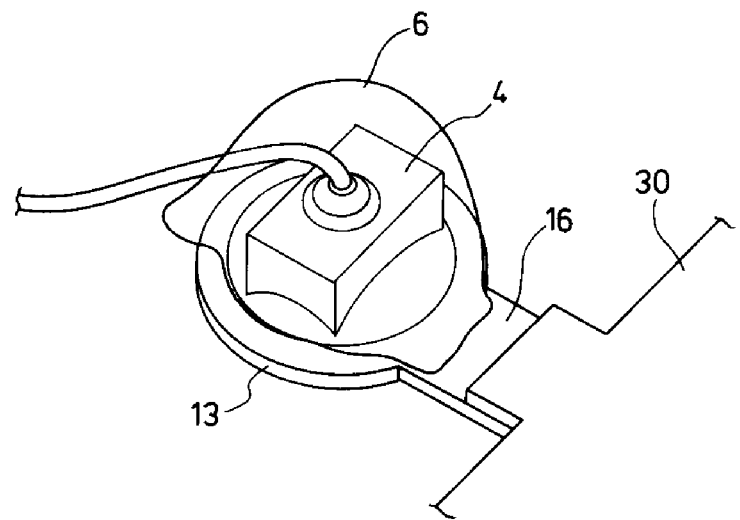
FIG. 7b  Second Comparament Embodiment
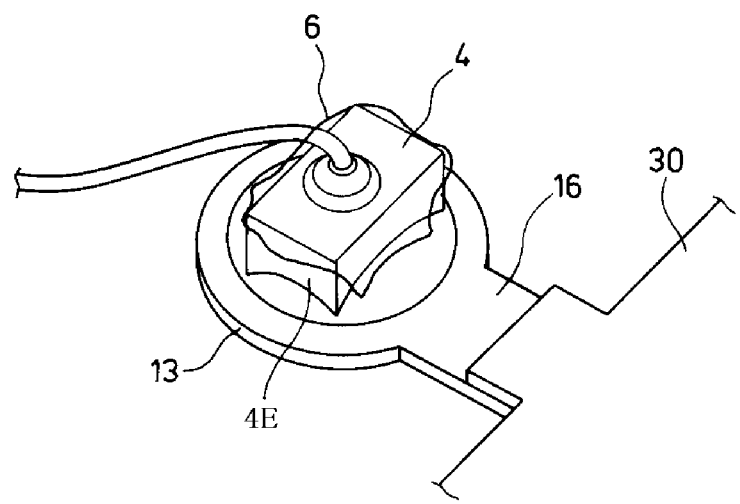

SEMICONDUCTOR LIGHT-EMITTING DEVICE HAVING DOUBLE ENCAPSULATING STRUCTURE

This application claims the priority benefit under 35 U.S.C. §119 of Japanese Patent Application No. 2014-060164 filed on Mar. 24, 2014, which is hereby incorporated in its entirety by reference.

BACKGROUND

1. Field

The presently disclosed subject matter relates to semiconductor light-emitting devices, and more particularly to surface mount semiconductor light-emitting devices having a double encapsulating structure, which can have favorable optical characteristics by forming a first encapsulating material in a substantially fair dome shape when a semiconductor light-emitting chip is encapsulated by the first encapsulating material.

2. Description of the Related Art

In various semiconductor light-emitting devices, surface mount light-emitting devices are frequently used for an electronic device such as a mobile phone, a personal computer and the like because they are small and can be directly mounted along with other electronic parts on a mounting circuit board in a reflow soldering process. Conventional semiconductor light-emitting devices of a surface mount type, for example, are disclosed in Patent Document No. 1 (Japanese Patent Application Laid Open JP2003-282952) and No. 2 (U.S. Pat. No. 8,115,106).

FIGS. 9a and 9b are an enlarged top view and an enlarged side cross-sectional view showing a first conventional semiconductor light-emitting device of the surface mount type, which may improve a reliability and may be miniaturized as a light source for a back light unit of an liquid crystal display (LCD) apparatus and the like and which is disclosed in Patent Document No. 1, respectively.

The first conventional semiconductor light-emitting device 70 includes: a circuit board 80 having a first end and a second end; a first conductor pattern 81 having a first external electrode 81a and a die-bonding pad 81b formed on the circuit board 80 and extending from the first end of the circuit board 80 toward a middle portion of the circuit board 80, the first external electrode 81a extending along the first end of the circuit board 80, and the die-bonding pad 81b extending from the first external electrode 81a toward the middle porting of circuit board 80; a second conductor pattern 82 having a second external electrode 82a and a wire-bonding pad 82b formed on the circuit board 80 and extending from the second end of the circuit board 80 toward the middle portion of the circuit board 80 so as not to contact with the die-bonding pad 81b, the second external electrode 82a extending along the second end of the circuit board 80, and the wire-bonding pad 82b extending from the second external electrode 82a toward the middle porting of circuit board 80; and wherein the first external electrode 81a of the first conductor pattern 81 and the second external electrode 82a of the second conductor pattern 82 are used to receive a power supply.

In addition, the first conventional semiconductor light-emitting device 70 also includes: a semiconductor light-emitting chip 83 having a first top electrode and a second top electrode mounted on the die-bonding pad 81b; a first bonding wire 84a electrically connecting between the first top electrode of the semiconductor light-emitting chip 83 and the die-bonding pad 81b of the first conductor pattern 81; a second bonding wire 84b electrically connecting between the second top electrode of the semiconductor light-emitting chip 83 and the wire-bonding pad 82b of the second conductor pattern 82; a first encapsulating resin 85 being composed of a transparent silicone resin, covering each of contact portions between the first top electrode of the chip 83 and the first bonding wire 84a and between the second top electrode of the chip 83 and the second bonding wire 84b, and encapsulating the semiconductor light-emitting chip 83 so as to be formed in a dome shape; and a second encapsulating resin 86 being composed of a transparent epoxy resin, encapsulating the first encapsulating layer 85 along with parts of the first and the second bonding wires 84a and 84b exposed from the first encapsulating resin 85, and being formed in a cubic shape on the circuit board 80.

When the semiconductor light-emitting chip 83 is encapsulated by the first encapsulating resin 85 in manufacturing processes for the conventional semiconductor light-emitting device 70, a predetermined amount of an uncured first encapsulating resin may be dropped from an upward direction of the semiconductor light-emitting chip 83 toward the chip 83 and may cover the semiconductor light-emitting chip 83 including each of the contact portions between the first top electrode of the chip 83 and the first bonding wire 84a and between the second top electrode of the chip 83 and the second bonding wire 84b in the dome shape therewith. After that, the first encapsulating resin 85 may be formed by heat-solidifying the uncured first encapsulating resin.

In this case, with reference to a central axis X of the chip 83, a first distance D1 of the die-bonding pad 81b between the central axis X of the chip 83 and an end 81ba of the first external electrode 81a of the first conductor pattern 81 differs from a second distance D2 of the die-bonding pad 81b between the central axis X of the chip 83 and an end 81bb of the die-bonding pad 81b of the first conductor pattern 81. Specifically, the first distance D1 is longer than the second distance D2 of the die-bonding pad 81b as shown in FIG. 9a.

Accordingly, the uncured first encapsulating resin, which is dropped from the upward direction of the semiconductor light-emitting chip 83 toward the chip 83 mounted on the die-bonding pad 81b so as to cover the semiconductor light-emitting chip 83 in the dome shape, may spread under wet conditions on the die-bonding pad 81b toward the first external electrode 81a. By contrast toward the first external electrode 81a, the spread under wet conditions of the uncured first encapsulating resin toward the second external electrode 82a may be stopped by the end 81bb of the die-bonding pad 81b.

As a result, the first encapsulating resin 85, which should be formed in a dome shape, may not become symmetric with reference to the central axis X of the semiconductor light-emitting chip 83, which is die-bonded on the die-bonding pad 81 of the first conductor pattern 81. That is, the first encapsulating resin 85 may be subject to an off-center arrangement with reference to the central axis X of the chip 83, and also the dome shape of the first encapsulating resin 85 may be variable when the conventional semiconductor light-emitting device 70 is manufactured in a mass production process.

The above-described variability of the dome shape of the first encapsulating resin 85 may cause variabilities of optical characteristics such as directional characteristics, when light emitted from the semiconductor light-emitting chip 83 transfers in the first encapsulating resin 85 and enters into the second encapsulating resin 86. Additionally, the variability of the dome shape of the first encapsulating resin 85 may also cause the variabilities of the optical characteristics such as the directional characteristics, when light emitted from the first encapsulating resin 85 transfers in the second encapsulating resin 86 and is emitted in an outward direction of the semiconductor light-emitting device 70. Thereby, the optical characteristics such as the directional characteristics and the like may result in various variabilities, which are clumsy to use in the first conventional semiconductor light-emitting device 70.

Especially, when the semiconductor light-emitting device 70 is used as wavelength-converting typed semiconductor light-emitting devices, in which a part of the light emitted from the semiconductor light-emitting chip 83 is converted into light having a different wavelength by a phosphor contained in the first encapsulating resin 85 and in which a mixture light including the light having the different wavelength mixed with the light emitted directly from the semiconductor light-emitting chip 83 is emitted, the semiconductor light-emitting devices are usually provided with a wavelength converting material such as the phosphor in the first encapsulating resin 85. Therefore, the variability of the dome shape of the first encapsulating resin 85 may cause color variability in the mixture light, which is emitted from the second encapsulating resin 86 of the semiconductor light-emitting device 70.

Moreover, when a top surface of the semiconductor light-emitting chip 83 is formed in a rectangular shape, the uncured first encapsulating resin, which is dropped on the top surface of the chip 83 being formed in the rectangular shape, may flow from longer side surfaces in a longitudinal direction of the top surface of the semiconductor light-emitting chip 83 along the longitudinal side surfaces in advance of short side surfaces of the chip 83, and may spread under wet conditions on the die-bonding pad 81*b* of the first conductor pattern 81.

Accordingly, the uncured first encapsulating resin, which may spread under wet conditions on the die-bonding pad 81*b* of the first conductor pattern 81, may spread larger toward the longitudinal side surfaces than the short side surfaces. The first encapsulating resin 85, which should be formed in a dome shape, may be subject to a lopsided shape having a larger amount of the resin toward the longitudinal side surfaces. The optical characteristics of the device 70 may also cause the various variabilities, which are clumsy to use, because the dome shape of the first encapsulating resin 85 may be variable when the conventional semiconductor light-emitting device 70 is manufactured in a mass production process.

Applicant of this disclosed subject matter discloses a second conventional surface mount semiconductor light-emitting device, which may freely form the shape of the first encapsulating resin of the first conventional light-emitting device 70, and which is disclosed in Patent Document No. 2 (U.S. Pat. No. 8,115,106). FIG. 10 is an enlarged side cross-sectional view depicting the second conventional surface mount semiconductor light-emitting device disclosed in Patent Document No. 2 (U.S. Pat. No. 8,115,106).

The second conventional semiconductor light-emitting device 40 includes: a circuit board 47 having a first end and a second end including a first board 47*a* and a second board 47*b*; a first conductor pattern 41 including a first external electrode 41*a* and a die-bonding pad 41*b*, the first external electrode 41*a* formed underneath a bottom surface of the second board 47*b* of the circuit board 47, the die-bonding pad 41*b* formed on the second board 47*b*, exposed from the first board 47*a* of the circuit board 47 and being located in a middle portion of the circuit board 47, the first conductor pattern 41 connecting the die-bonding pad 41, surrounding the die-bonding pad 41*b*, and connecting from the die-bonding pad 41*b* toward the first external electrode 41*a* on the first board 47*a* and the second board 47*b* via the first end of the circuit board 47; a second conductor pattern 42 including a second external electrode 42*a* and a wire-bonding pad 42*b*, the second external electrode 42*a* formed underneath the bottom surface of the second board 47*b* and facing the first external electrode 41*a* underneath the bottom surface of the second board 47*b* of the circuit board 47, the wire-bonding pad 42*b* formed on the first board 47*a* of the circuit board 47, the second conductor pattern 42 extending from the wire-bonding pad 42*b* toward the second external electrode 42*a* via the second end of the circuit board 47 so that the first external electrode 41*a* does not contact with the second external electrode 42*a*; and wherein the first external electrode 41*a* of the first conductor pattern 41 and the second external electrode 42*a* of the second conductor pattern 42 are used to receive a power supply.

In addition, the second conventional semiconductor light-emitting device 40 also includes: a semiconductor light-emitting chip 43 having a top electrode and a bottom electrode mounted on the die-bonding pad 41*b*, and surrounded by the first conductor pattern 41, the bottom electrode thereof being electrically connected to the die-bonding pad 41*b*; a bonding wire 44 electrically connecting between the top electrode of the semiconductor light-emitting chip 43 and the die-bonding pad 42*b* of the second conductor pattern 41; a first encapsulating resin 45 encapsulating the semiconductor light-emitting chip 83 along with a contact portion between the top electrode of the chip 83 and the bonding wire 44; and a second encapsulating resin 46 encapsulating the first encapsulating layer 45 along with a part of the bonding wire 44 exposed from the first encapsulating resin 45.

Therefore, the second conventional semiconductor light-emitting device 40 can form favorable shapes of the first encapsulating resin 45 by laminating the first board 47*a* having an opening and the second board 47*b* as the circuit board 47. In addition, the light-emitting device 40 can improve reliability by providing a space between the first encapsulating resin 45 and the second encapsulating resin 46 even when each of thermal expansion coefficients of the first encapsulating resin 45 and the second encapsulating resin 46 differs. However, the circuit board 47 of the second conventional semiconductor light-emitting device 40 needs to laminate two boards.

The above-referenced Patent Documents are listed below, and are hereby incorporated with their English abstracts in their entireties.
1. Patent Document No. 1: Japanese Patent Application Laid Open JP2003-282952.
2. Patent Document No. 2: U.S. Pat. No. 8,115,106.

The disclosed subject matter has been devised to consider the above and other problems, features, and characteristics. Thus, embodiments of the disclosed subject matter can include small semiconductor light-emitting devices with a simple structure, in which a semiconductor light-emitting chip can be mounted on a circuit board without a laminate, and which can emit a wavelength converted light having excellent optical characteristics. The disclosed subject matter can also include a semiconductor light-emitting chip having a rectangular top and bottom surface that can be used for wavelength-converting light having the excellent optical characteristics.

SUMMARY

The presently disclosed subject matter has been devised in view of the above and other problems, features, and characteristics. An aspect of the disclosed subject matter includes providing small semiconductor light-emitting devices with a simple structure, in which a first encapsulating material can be formed in a substantially fair dome shape only by forming a favorable shape of a first conductor pattern, and having excellent optical characteristics such that can be used to illuminate goods laid out in a narrow show window, a vending machine and the like, and also can be used to illuminate letters and figures in a thin display for the vending machine and the like using various color lights by dispersing a wavelength converting material in the first encapsulating material.

According to an aspect of the disclosed subject matter, a semiconductor light-emitting device can include: a circuit board having a first side surface and a second side surface located between a top surface and a bottom surface thereof, and being formed in a substantially rectangular tabular shape, and the first side surface and the second side surface located in an opposite direction with respect to each other; and a first conductor pattern including a first external electrode and a die-bonding portion, the first external electrode extending from the top surface of the circuit board toward the bottom surface of the circuit board along a longitudinal direction of the circuit board via the first side surface of the circuit board, and the die-bonding portion having a die-bonding pad, at least one die-bonding first wire bonding pad and a connecting pattern extending from the first external electrode toward a middle portion on the top surface of the circuit board along the longitudinal direction of the circuit board, the connecting pattern being electrically connected between the die-bonding pad and the first external electrode, the die-bonding pad formed in a substantially circular shape, a plurality of apical ends of the die-bonding pad located on an outer circumference of the circular shape, and the at least one die-bonding first wire bonding pad projecting from the outer circumference of the die-bonding pad in an outward direction of the die-bonding pad, wherein a respective one of the apical ends of the die-bonding pad is located in each of middle portions of circular connecting portions between the die-bonding pad and the connecting pattern and between the die-bonding pad and the at least one die-bonding first wire bonding pad.

In addition, the semiconductor light-emitting device can also include: a second conductor pattern including an second external electrode and a second wire bonding pad, the second external electrode extending from the top surface of the circuit board toward the bottom surface of the circuit board along the longitudinal direction of the circuit board via the second side surface of the circuit board, the second wire bonding pad projecting from the second external electrode toward the first conductor pattern along the longitudinal direction on the top surface of the circuit board; and a semiconductor light-emitting chip having a first electrode and a second electrode mounted on the die-bonding pad of the first conductor pattern, a top surface of the semiconductor light-emitting chip having a substantially center formed in either a substantially square shape or a substantially rectangular shape, the center of the top surface of the chip being located over a central point of the die-bonding pad of the first conductor pattern, the first electrode of the chip formed either on the top surface of the chip or underneath a bottom surface of the chip, the second electrode of the chip formed on the top surface of the chip and being electrically connected to the second wire bonding pad of the second conductor pattern via a second bonding wire.

Moreover, the semiconductor light-emitting device can also include: a first encapsulating material encapsulating the semiconductor light-emitting chip and a part of the second bonding wire in a dome shape on the top surface of the circuit board; a second encapsulating resin covering at least the first encapsulating material and another part of the second bonding wire exposed from the first encapsulating material; and wherein each of angles between the adjacent imaginary lines connecting the central point of the die-bonding pad to the plurality of apical ends of the die-bonding pad is configured to become a substantially same angle.

In the above-described exemplary semiconductor light-emitting device, the semiconductor light-emitting device can further include a first wire bonding pad projecting from the first external electrode of the first conductor pattern toward the second conductor pattern along the longitudinal direction on the top surface of the circuit board, and located in an opposite direction of the second wire bonding pad of the second conductor pattern with respect to the die-bonding portion, wherein when the first electrode of the chip is formed on the top surface of the chip, the first electrode of the chip is electrically connected to the first wire bonding pad via a first bonding wire, and when the first electrode of the chip is formed underneath the bottom surface of the chip, the first electrode of the chip is electrically connected to the die-bonding pad via a conductive adhesive material while the chip is die-bonded on the die-bonding pad so as to harmonize a location (on the top surface and/or underneath the bottom surface of the chip) of the first electrode, and also can further include: a first resist layer formed on the first external electrode and a part of the connecting pattern, and thereby the connecting pattern forming an exposed connecting pattern, which is exposed from the first resist layer, and a part of the first resist layer located between at least the first external electrode and the second encapsulating resin; and a second resist layer formed on the second external electrode, and a part of the second resist layer located between the second external electrode and the second encapsulating resin so as not to damage the second encapsulating resin at a soldering process of the device on a mounting circuit board.

Additionally, also in the above-described exemplary semiconductor light-emitting device, when the at least one die-bonding first wire bonding pad is odd, the die-bonding first wire bonding pad facing the connecting pattern can be formed in a substantially same dimension as the connecting pattern symmetrically with reference to the central point of the die-bonding pad, and when the at least one die-bonding first wire bonding pad is even, each of the at least one die-bonding first wire bonding pad can be formed in a substantially same dimension as the connecting pattern with reference to a direction of the central point of the die-bonding first wire bonding pad, so that the first encapsulating material is formed in a substantially fair dome shape. When the top surface of the chip is formed in the substantially rectangular shape, the at least one die-bonding first wire bonding pad can become odd, and each of side surfaces of the longitudinal direction of the top surface of the chip can face the connecting pattern and the die-bonding first wire bonding pad facing the connecting pattern via the chip, respectively, for a same reason as the above description.

Moreover, also in the above-described exemplary semiconductor light-emitting device, the first encapsulating material can include at least one of a yellow phosphor, a red phosphor, a green phosphor and a blue phosphor, and when the chip is a blue light-emitting diode, the first encapsulating material can include at least one of a yellow phosphor, a red phosphor and a green phosphor, and also when the chip is a light-emitting diode emitting ultraviolet light, the first encapsulating material can include at least one of a red phosphor, a green phosphor and a blue phosphor, so that the device can emit various color lights including light having a substantially white color tone.

According to the above-described exemplary semiconductor light-emitting device, the first encapsulating material can be formed in the substantially fair dome shape only by forming a favorable shape of the first conductor pattern, and the device can various color lights including white light by dispersing the wavelength converting material in the first encapsulating material. Thus, the disclosed subject matter can provide small semiconductor light-emitting devices with a simple structure and having excellent optical characteristics such that can be used to illuminate goods laid out in a narrow show window, a vending machine and the like, and also can be used to illuminate letters and figures in a thin display for the vending machine, and the like.

BRIEF DESCRIPTION OF THE DRAWINGS

These and other characteristics and features of the disclosed subject matter will become clear from the following description with reference to the accompanying drawings, wherein:

FIG. 3 is an enlarged top view depicting a first comparative embodiment to evaluate the first embodiment of the semiconductor light-emitting device shown in FIG. 1 to FIG. 2b;

FIGS. 4a and 4b are partial enlarged perspective views depicting vicinities of a die-bonding pad of a die-bonding portion of a first conductor pattern to show evaluating results of the first comparative embodiment shown in FIG. 3, respectively;

FIG. 6a is an enlarged top view showing a second exemplary embodiment of the semiconductor light-emitting device made in accordance with principles of the disclosed subject matter, and FIG. 6b is an enlarged top view showing a second comparative embodiment to evaluate the second embodiment of the semiconductor light-emitting device shown in FIG. 6a;

FIGS. 7a and 7b are partial enlarged perspective views depicting vicinities of a die-bonding pad of a die-bonding portion of a first conductor pattern to show evaluating results of the second comparative embodiment of the semiconductor light-emitting device shown in FIG. 6b, respectively;

FIG. 8 is an enlarged top view showing an exemplary variation of the second embodiment of the semiconductor light-emitting device shown in FIG. 6a;

DETAILED DESCRIPTION OF EXEMPLARY EMBODIMENTS

Figure 1:
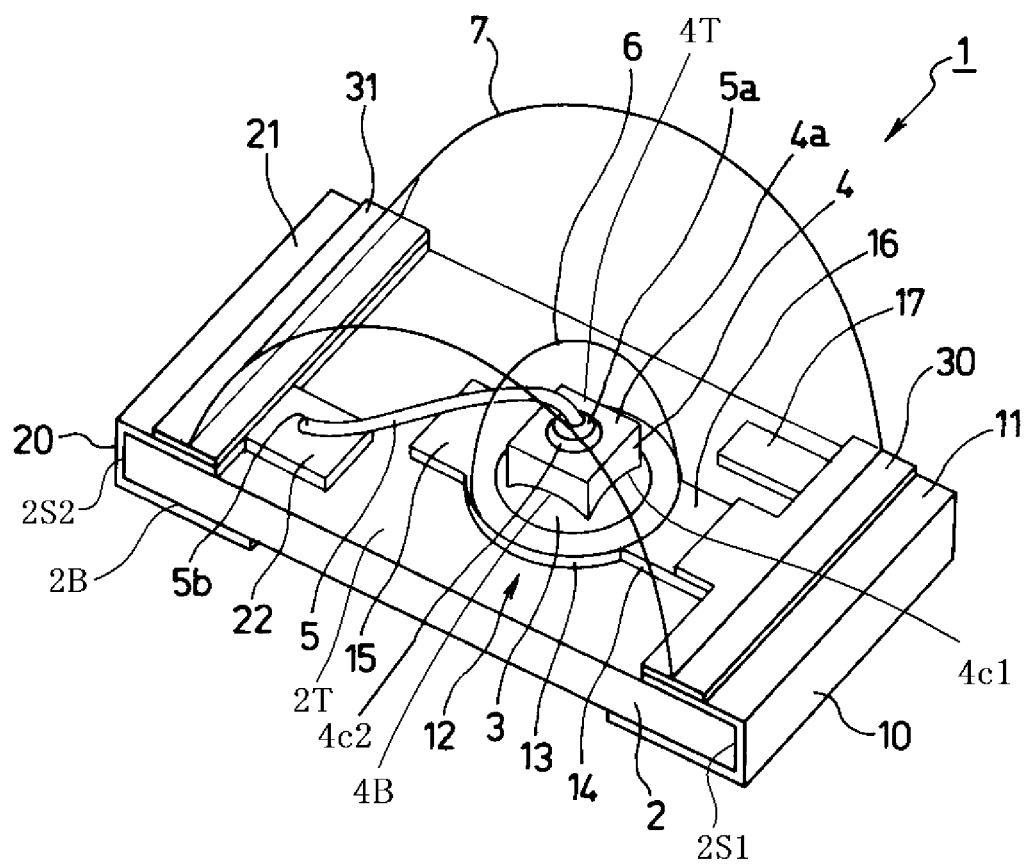
FIG. 1 is an enlarged perspective view showing a first exemplary embodiment of a semiconductor light-emitting device made in accordance with principles of the disclosed subject matter.

Exemplary embodiments of the disclosed subject matter will now be described in detail with reference to FIG. 1 to FIG. 8, in which the same or corresponding elements use the same reference marks. FIG. 1 is an enlarged perspective view showing a first exemplary embodiment of a semiconductor light-emitting device made in accordance with principles of the disclosed subject matter.

The semiconductor light-emitting device 1 can include: a circuit board 2 having a top surface 2T, a bottom surface 2B, and a first side surface 2S1 and a second surface 2S2 located between the top surface 2T and the bottom surface 2B, the circuit board 2 formed in a substantially rectangular tabular shape; and a first conductor pattern 10 including an first external electrode 11, a first wire bonding pad 17 and a die-bonding portion 12, the first external electrode 11 extending from the top surface 2T toward the bottom surface 2B along a longitudinal direction of the circuit board 2 via the first side surface 2S1 of the circuit board 2, the die-bonding portion 12 including a die-bonding pad 13, a connecting portion 14 and a die-bonding projection pattern 15, and extending from the first external electrode 11 toward a middle portion of the circuit board 2 along the longitudinal direction of the circuit board 2, the first wire bonding pad 17 also extending from the first external electrode 11 along the longitudinal direction of the circuit board 2 and along the die-bonding portion 12.

In addition, the semiconductor light-emitting device 1 can also include a second conductor pattern 20 including an second external electrode 21 and a second wire bonding pad 22, the second external electrode 21 extending from the top surface 2T toward the bottom surface 2B along the longitudinal direction of the circuit board 2 via the second side surface 2S2 of the circuit board 2, the second wire bonding pad 22 extending from the second external electrode 21 along the longitudinal direction of the circuit board 2 and projecting in an opposite direction of the first wire bonding pad 17 with respect to the die-bonding portion 12, which extends from the first external electrode 11 toward the middle portion of the circuit board 2 along the longitudinal direction of the circuit board 2.

Moreover, the semiconductor light-emitting device 1 can also include: a semiconductor light-emitting chip 4 having a top surface 4T, a bottom surface 4B, a light-emitting surface 4a, a first electrode 4c1 and a second electrode 4c2 being die-bonded on the die-bonding pad 13 of the first conductor pattern 10 via a conductive adhesive material 3, the first electrode 4c1 of the semiconductor light-emitting chip 4 being electrically connected to the die-bonding pad 13 via the conductive adhesive material 3 when the first electrode 4c1 is formed underneath the bottom surface 4B; a bonding wire 5 electrically connecting between the second electrode 4c2 of the semiconductor light-emitting chip 4 and the second wire bonding pad 22 of the second conductor pattern 20 when the second electrode 4c2 is formed on the top surface 4T, wherein the second wire bonding pad 22 can be electrically connected to the second electrode 4c2 using a ball bonding 5a and can be electrically connected to the second wire bonding pad 22 using a stitch bonding; a first encapsulating material 6 encapsulating the semiconductor light-emitting chip 4 along with at least a connecting portion between the second electrode 4c2 located on the top surface 4T of the chip 4 and the bonding wire 5 in a dome shape; and a second encapsulating resin 7 encapsulating the first encapsulating material 6, parts of the first conductor pattern 10 and the second conductor pattern 20, a part of the bonding wire 5, which is exposed from the first encapsulating material 6, and the top surface 2T of the circuit board 2, which is exposed from the first encapsulating material 6 and the first and the second conductor patterns 10 and 20.

The above-described elements will now be described with reference to FIGS. 2a and 2b, which are enlarged top views showing the first embodiment of the semiconductor light-emitting device, wherein FIG. 2b abbreviates some marks to show an exemplary wavelength converting material contained in the first encapsulating material 6 and to show exemplary major dimensions. As the circuit board 2, a resin board such as a silicone resin board, a glass epoxy board and the like, a metallic board such as an aluminum substrate, an iron substrate and the like, and a ceramic substrate can be used.

The die-bonding portion 12 of the first conductor pattern 10 can include: the die-bonding pad 13 formed in a substantially circular shape, and being located in the middle portion on the top surface 2T of the circuit board 2; the connecting portion 14 electrically connecting between the die-bonding pad 13 and the first external electrode 11 of the first conductor pattern 10; the die-bonding projection pattern 15 extending from the die-bonding pad 13 in an opposite direction of the connecting portion 14 of the first conductor pattern 10; the first wire bonding pad 17 extending from the first external electrode 11 along the connecting portion 14 and also extending along the longitudinal direction of the circuit board 2; a first resist layer 30 covering parts of the first external electrode 11 and the connecting portion 14 so as not to damage the second encapsulating resin 7 when the device 1 is mounted on a mounting board and the like using the first external electrode 11 via a solder, etc.; and the connecting portion 14 including an exposed connecting portion 16, which is exposed from the resist layer 30.

In this case, when a length between an end 15a of the die-bonding projection pattern 15 toward the second conductor pattern 20 and a first apical end 13a1 of the die-bonding pad 13 toward the die-bonding projection pattern 15 is defined as a first length L1, and when a length between an end 16a of the exposed connecting portion 16 toward the first conductor pattern 10 and a second apical end 13a2 of the die-bonding pad 13 toward the connecting portion 14 is defined as a second length L2, the first length L1 can substantially equal in length to the second length L2. Each of the first length L1 and the second length L2 can be approximately 0.2 millimeter as shown in FIG. 2b.

Figure 2A:
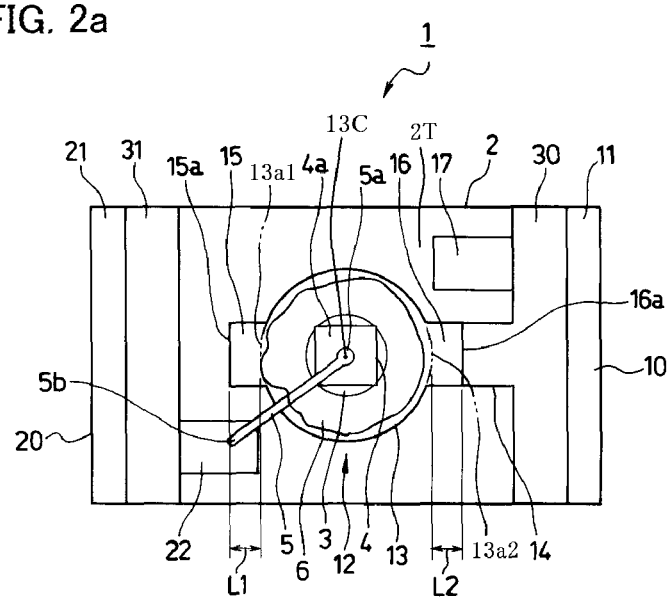
FIGS. 2a and 2b are enlarged top views showing the first embodiment of the semiconductor light-emitting device shown in FIG. 1, wherein FIG. 2b abbreviates some marks to show an exemplary wavelength converting material contained in a first encapsulating material and to show exemplary major dimensions.
Figure 2B:
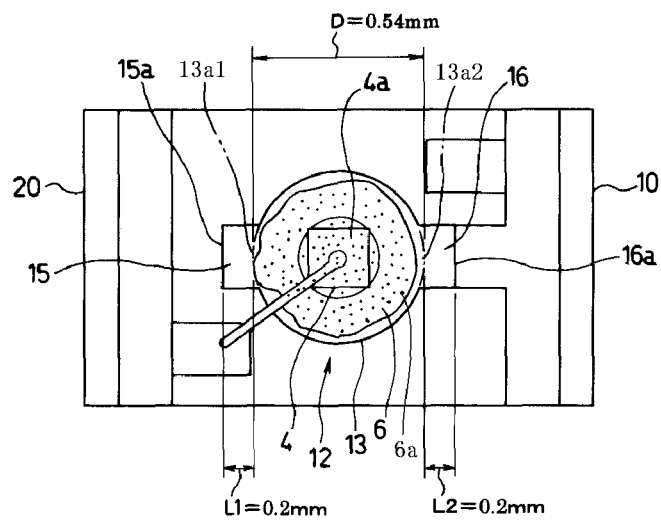

The second conductor pattern 20 can include: the second external electrode 21 located in substantially parallel with the first external electrode 10 and extending from the top surface 2T toward the bottom surface 2B along the longitudinal direction of the circuit board 2 via the second side surface 2S2 of the circuit board 2; the second wire bonding pad 22 extending from the second external electrode 21 toward the first conductor pattern 10 and extending from the second external electrode 21 in the opposite direction of the first wire bonding pad 17 of the first conductor pattern 10 with respect to the die-bonding portion 12, which electrically connects to the first external electrode 11 of the first conductor pattern 10; and a second resist layer 31 covering a part of the second wire bonding pad 22 as shown in FIG. 2a.

When a power supply is applied between the first external electrode 11 of the first conductor pattern 10 and the second external electrode 21 of the second conductor pattern 20, because the power supply is applied between the second electrode 4c2 and the first electrode 4c1 located underneath the bottom surface 4B of the semiconductor light-emitting chip 4 via the bonding wire 5 and via the die-bonding pad 13 and the conductive adhesive material 3, respectively, the semiconductor light-emitting chip 4 can emit light mainly from the light-emitting surface 4a.

As the first and the second conductor patterns 10 and 20, when the circuit board 2 is made of the resin board, a thin layer of copper (Cu) can be formed on the circuit board 2, and then the circuit board 2 having a multi metallic layer can be made by plating Cu, nickel (Ni), palladium (Pd) and gold (Au) in turn on the thin layer of Cu. As the conductive adhesive material 3, a resin paste such that mixes a metallic powder such as a Ni, silver (Ag) and the like with a resin, a solder and an eutectic paste can be used. A metallic wire including at least one of Au, Ag, Al and the like can be used as the bonding wire 5.

As the semiconductor light-emitting chip 4, a light-emitting diode (LED), a laser diode and the like can be used. When the semiconductor light-emitting chip is a blue LED emitting blue light, YAG phosphor ($Y_3Al_5O_{12}$: $Ce^{3+}$), SiAlON phosphor, an orthosilicate phosphor and like can be used as the wavelength converting material 6a, which is dispersed in the first encapsulating material 6 so that the semiconductor light-emitting device 1 can emit light having a substantially white color tone.

When the semiconductor light-emitting chip 4 is a blue LED chip having a peak wavelength of approximately 460 nanometers and the first encapsulating material 6 includes the wavelength converting material 6a, the wavelength converting material 6a can convert light emitted from the semiconductor light-emitting chip 4 into a particular wavelength or range of wavelengths of light by being excited using the light emitted from the semiconductor light-emitting chip 4. Accordingly, the semiconductor light-emitting device 1 can emit light having a different wavelength from that of the semiconductor light-emitting chip 4 by an additive color mixture of a part of the light emitted from the semiconductor light-emitting chip 4 and the wavelength converted light excited by another part of the light.

The first encapsulating material 6 including the wavelength converting material 6a can be made by mixing a yellow phosphor such as YAG phosphor, SiAlON phosphor, an orthosilicate phosphor and like with a transparent resin such as a silicone resin, an epoxy resin and the like. Organic solvents such as an alcohol and the like can be used in place of the transparent resin. When the semiconductor light-emitting chip 4 is the blue LED chip having a peak wavelength of 460 nanometers, the yellow phosphor can emit a yellow light upon being excited by blue light emitted from the blue LED chip. The semiconductor light-emitting device 1 can emit substantially white light that can be used as a light source for a vending machine, a back light unit, a show window and the like, by an additive color mixture of the excited yellow light emitted from the yellow phosphor and a part of the blue light emitted from the blue LED chip.

In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device 1 can emit light having substantially white light by an additive color mixture of the red-purple light emitted from the red phosphor that is excited by the blue light, the blue-green light emitted from the green phosphor that is excited by the blue light and a part of the blue light. The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6 (O, N)$: $Eu^{2+}$ and the like can be used as the green phosphor.

In addition, when the semiconductor light-emitting chip 4 is a light-emitting diode, which emits ultraviolet light, the first encapsulating material 6 can include at least one of the red phosphor, the green phosphor and a blue phosphor such as $(Sr, Ca, Ba, Mg)_{10}(PO_4)_6C_{12}$: $Eu^{2+}$, $BaMgAl_{10}O_{17}$: $Eu^{2+}$, $LaAl(Si, Al)_6(N, O)_{10}$: $Ce^{3+}$, etc. as the wavelength converting material 6a. In this case, the semiconductor light-emitting device 1 can various color light including substantially white color light based upon an additive color mixture of light's three primary colors of red-green-blue by adjusting each ratio of amounts of the red phosphor, the green phosphor and the blue phosphor.

When the first encapsulating material 6 does not include the wavelength converting material 6a, the first encapsulating material 6 can employ a resin having a lower refractive index than that of the second encapsulating resin 7. As the second encapsulating resin 7, a silicone resin, an epoxy resin, a glass and the like can be used. The second encapsulating resin 7 can be formed by a potting method, a transfer molding method, a compressor molding method, and the like.

When the first encapsulating material 6 is formed on the die-bonding portion 12, the predetermined amount of the uncured first encapsulating resin can be dropped from the upward direction of the semiconductor light-emitting chip 4, and can cover the chip 4 and the connecting portion between the second electrode 4c2 located on the top surface 4T of the chip 4 and the bonding wire 5 in a dome shape. In this case, the uncured first encapsulating resin having the predetermined amount, which is dropped from the upward direction of the semiconductor light-emitting chip 4 can be spread under wet conditions from the top surface 4T of the chip 4 toward the die-bonding pad 13 via side surfaces of the chip 4, and can be spread under wet conditions from the die-bonding pad 13 toward the die-bonding projection pattern 15 and the exposed connecting portion 16, which is located in the opposite direction of the die-bonding projection pattern 15.

The first length L1 of the die-bonding projection pattern 15 can substantially equal in length to the second length L2 of the exposed connecting portion 16 as described above. The uncured first encapsulating resin can balance an amount spread under wet conditions on the die-bonding projection pattern 15 with an amount spread under wet conditions on the exposed connecting portion 16. Accordingly, the uncured first encapsulating resin, which should be formed in a fair dome shape, may not be eccentrically-located in an extending direction of the die-bonding portion 12 and also may not be eccentrically-located in a direction perpendicular to the extending direction of the die-bonding portion 12 due to the die-bonding pad 13 formed in a circular shape. Thereby, the first encapsulating material 6 can be formed in a substantially fair dome shape at a high yield ration and a high repeatability.

Therefore, directional characteristics of light transferred in the first encapsulating material 6 after being emitted from the semiconductor light-emitting chip 4 can be substantially fair, and light emitted from the second encapsulating resin 7 can also maintain substantially fair directional characteristics. Especially, when the first encapsulating material 6 contains the wavelength converting material 6a to wavelength-convert the light emitted from the semiconductor light-emitting chip 4, because path lengths of the light transferred in the first encapsulating material 6 after being emitted from the chip 4 can be substantially even, the light transferred in the first encapsulating material 6 can reduce a color variability. Consequently, the semiconductor light-emitting device 1 of the disclosed subject matter can emit the mixture light having a high uniform color tone from the second encapsulating resin 7.

Next, evaluating results with respect to the first encapsulating material 6 of the semiconductor light-emitting device 1 will now be described. In the first embodiment of the semiconductor light-emitting device 1, a diameter D of the die-bonding pad 13 formed in a substantially circular shape of the first conductor pattern 10 is 0.54 millimeters, and each of the first length L1 of the die-bonding projection pattern 15 and the second length L2 of the exposed connecting portion 16 is 0.2 millimeters as shown in FIG. 2b.

In a first comparative embodiment, the diameter D of the die-bonding pad 13 formed in the substantially circular shape of the first conductor pattern 10 is also 0.54 millimeters, and each of the first length L1 of the die-bonding projection pattern 15 and the second length L2 of the exposed connecting portion 16 is also 0.2 millimeters in common with the first embodiment as shown in FIG. 3. In each of the first embodiment and the first comparative embodiment, a light-emitting chip having the top surface 4T of 0.19 square millimeters as the semiconductor light-emitting chip 4 is die-bonded on the die-bonding pad 13, and an organic solvent dispersing an orthosilicate phosphor therein as the first encapsulating material 6 including the wavelength converting material 6a is heat-solidified after it is dropped from the upward direction of the semiconductor light-emitting chip 4 so as to cover the chip 4 therewith.

In the first comparative embodiment of samples of 48 pieces, the first comparative embodiment of 30 pieces spread under wet conditions toward the first resist layer 30 and spread out of the die-bonding pad 13 and the exposed connecting portion 16 as shown in FIG. 4a, which is a partial enlarged perspective view depicting a vicinity of the die-bonding pad 13 of the die-bonding portion 12 of the first conductor pattern 10. The semiconductor light-emitting chip 4 of one piece exposed a side surface portion 4E of the chip 4, which is located in an opposite direction of the exposed connecting portion 16 and in a direction perpendicular to the opposite direction of the exposed connecting portion 16, from the first encapsulating material 6 as shown in FIG. 4b.

By contrast to the first comparative embodiment, in the first embodiment of samples of the same 48 pieces as the first comparative embodiment, only one piece spreads under wet conditions toward the first resist layer 30, and the first encapsulating material 6 slightly spread out of the die-bonding pad 13 and the exposed connecting portion 16 in the only one piece of the semiconductor light-emitting device 1.

As the result of the evaluations, sources learned that the first encapsulating material 6 may be formed in a substantially fair dome shape at a high yield ration and a high repeatability so as to cover the semiconductor light-emitting chip 4 therewith using the potting method by forming the die-bonding portion 12 of the first conductor pattern 10, which includes the die-bonding pad 13 to die-bond the semiconductor light-emitting chip 4 and each of the die-bonding projection pattern 15 and the exposed connecting portion 16 extending from the die-bonding pad 13 in a radial fashion having a substantially same interval and a substantially same dimension with respect to each other.

Figure 5A:
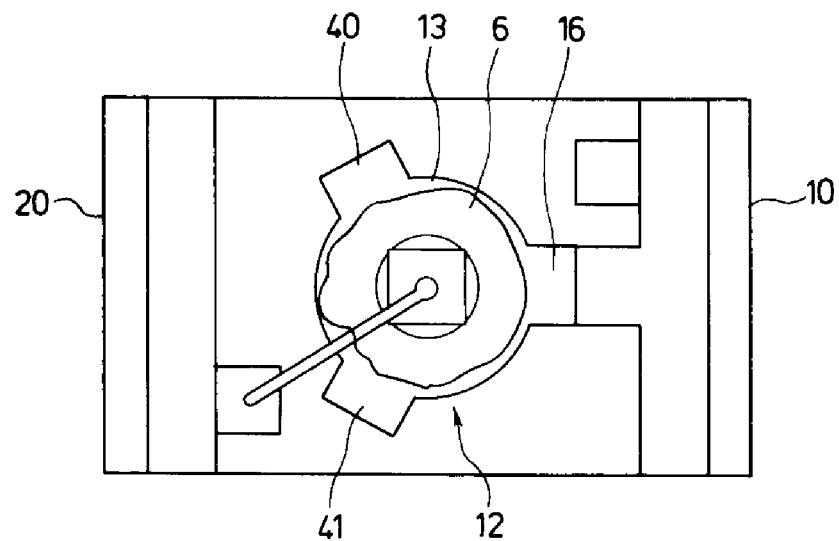
FIGS. 5a and 5b are enlarged top views showing an exemplary variation and another exemplary variation of the first embodiment of the semiconductor light-emitting device shown in FIG. 1 to FIG. 2b, respectively.

Therefore, the die-bonding portion 12 of the first conductor pattern 10 can include the die-bonding pad 13 and each of a first die-bonding projection pattern 40, a second die-bonding projection pattern 41 and the exposed connecting portion 16 extending from the die-bonding pad 13 in the radial fashion having a substantially same interval of 120 degrees and the substantially same dimension with respect to each other as shown in FIG. 5a, which is an enlarged top view showing an exemplary variation of the first embodiment of the semiconductor light-emitting device 1.

Figure 5B:
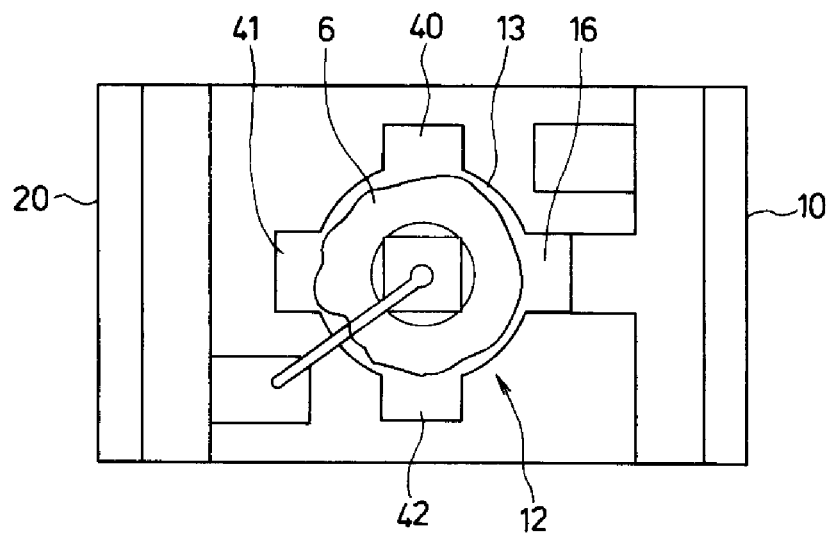

In addition, the die-bonding portion 12 of the first conductor pattern 10 can include the die-bonding pad 13 and each of the first die-bonding projection pattern 40, the second die-bonding projection pattern 41, a third die-bonding projection pattern 42 and the exposed connecting portion 16 extending from the die-bonding pad 13 in the radial fashion having a substantially same interval of 90 degrees and the substantially same dimension with respect to each other as shown in FIG. 5b, which is an enlarged top view showing another exemplary variation of the first embodiment of the semiconductor light-emitting device 1 of the disclosed subject matter. The first encapsulating material 6 can also be formed in a substantially fair dome shape at a high yield ration and a high repeatability so as to cover the semiconductor light-emitting chip 4 therewith in each of structures shown in FIGS. 5a and 5b in common with the structure shown in FIG. 1.

Second exemplary embodiments will now be described with reference to FIG. 6, which is an enlarged top view showing a second exemplary embodiment of the semiconductor light-emitting device made in accordance with principles of the disclosed subject matter. A difference between the second embodiment and the first embodiment of the semiconductor light-emitting device shown in FIG. 1 relates to a shape of the top surface 4T of the semiconductor light-emitting chip 4. The top surface 4T of the semiconductor light-emitting chip 4 of the first embodiment is formed in a substantially square shape, the top surface 4T of the chip 4 of the second embodiment, by contrast, is formed in a substantially rectangular shape.

When the top surface 4T of the semiconductor light-emitting chip 4 is rectangular, electrodes of the chip 4 are frequently located on the top surface 4T of chips 4. Accordingly, a case where the first top electrode 4c1 and the second electrode 4c2 are located on the top surface 4T of the semiconductor light-emitting device 1A will now be described with reference to FIG. 6a. The semiconductor light-emitting chip 4 of the semiconductor light-emitting device 1A can be located on the die-bonding pad 13 of the die-bonding portion 12 so that each of side surfaces in a longitudinal direction of the chip 4 faces the die-bonding projection pattern 15 and the exposed connecting portion 16, respectively.

A first wire bonding 5C1 can electrically connect between the first top electrode 4c1 of the chip 4 and the first wire bonding pad 17 of the first conductor pattern 10, and a second wire bonding 5C2 can electrically connect between the second top electrode 4c2 of the chip 4 and the second wire bonding pad 22 of the second conductor pattern 20 in common with the semiconductor light-emitting device 1 of the first embodiment. Thereby, when the power supply is applied between the first conductor pattern 10 and the second conductor pattern 20, the semiconductor light-emitting chip 4 can emit light mainly from the light-emitting surface 4a in common with the semiconductor light-emitting device 1 of the first embodiment.

When the first encapsulating material 6 is formed on the die-bonding portion 12, the predetermined amount of the uncured first encapsulating resin can be dropped from the upward direction of the semiconductor light-emitting chip 4, and can cover the chip 4 and connecting portions between the first top electrode 4c1 of the chip 4 and the first bonding wire 5C1 and between the second top electrode 4c2 of the chip 4 and the second bonding wire 5C2 in a dome shape. In this case, the uncured first encapsulating resin having the predetermined amount, which is dropped from the upward direction of the semiconductor light-emitting chip 4, may be spread under wet conditions from the side surfaces in the longitudinal direction of the chip 4 toward the die-bonding pad 13 in advance of side surfaces in a direction perpendicular to the longitudinal direction of the chip 4. Accordingly, the uncured first encapsulating resin can be spread under wet conditions substantially evenly from the die-bonding pad 13 toward the die-bonding projection pattern 15 and the exposed connecting portion 16, which is located in the opposite direction of the die-bonding projection pattern 15, because the first length L1 of the die-bonding projection pattern 15 substantially equals in length to the second length L2 of the exposed connecting portion 16 as described above.

Therefore, the uncured first encapsulating resin, which should be formed in a fair dome shape, may not be eccentrically-located in the extending direction of the die-bonding portion 12 and also may not be eccentrically-located in the direction perpendicular to the extending direction of the die-bonding portion 12 due to the die-bonding pad 13 formed in a circular shape. And then, the first encapsulating material 6 can be formed in a substantially fair dome shape at a high yield ration and a high repeatability by heat-solidifying the uncured first encapsulating resin.

Accordingly, directional characteristics of light transferred in the first encapsulating material 6 after being emitted from the semiconductor light-emitting chip 4 can be fair, and light emitted from the second encapsulating resin 7 can also maintain substantially fair directional characteristics. Especially, even when the first encapsulating material 6 contains the wavelength converting material 6a to wavelength-convert the light emitted from the semiconductor light-emitting chip 4, because path lengths of the light transferred in the first encapsulating material 6 after being emitted from the chip 4 can be substantially even, the light transferred in the first encapsulating material 6 can reduce a color variability. Thus, the semiconductor light-emitting device 1A of the disclosed subject matter can also emit the mixture light having a high uniform color tone from the second encapsulating resin 7.

Next, evaluating results with respect to the first encapsulating material 6 of the semiconductor light-emitting device 1A will now be described. In the semiconductor light-emitting device 1A of the second embodiment, a diameter D of the die-bonding pad 13 formed in a substantially circular shape of the first conductor pattern 10 is 0.54 millimeters, and each of the first length L1 of the die-bonding projection pattern 15 and the second length L2 of the exposed connecting portion 16 is 0.2 millimeters as shown in FIG. 2b.

In the semiconductor light-emitting device 1A of the second embodiment, a semiconductor light-emitting chip having a top surface 4T, which is formed in a rectangular shape having opposite sides of 0.22 millimeters and other opposite sides of 0.27 millimeters, is employed as the semiconductor light-emitting chip 4. The semiconductor light-emitting chip 4 is die-bonded on the die-bonding pad 13 so that each of the side surfaces in the longitudinal direction of the chip 4 faces the die-bonding projection pattern 15 and the exposed connecting portion 16, respectively, as shown in FIG. 6a.

On the other hand, also in a second comparative embodiment shown in FIG. 6, the semiconductor light-emitting chip having the top surface 4T, which is formed in the rectangular shape having the opposite sides of 0.22 millimeters and the other opposite sides of 0.27 millimeters, is employed as the semiconductor light-emitting chip 4. The semiconductor light-emitting chip 4 is die-bonded on the die-bonding pad 13 so that one of the side surfaces in the longitudinal direction of the chip 4 faces the exposed connecting portion 16.

In samples of 48 pieces of each of the second embodiment (the semiconductor light-emitting device 1A) and the second comparative embodiment, the organic solvent dispersing an orthosilicate phosphor therein as the first encapsulating resin 6 including the wavelength converting material 6a was heat-solidified after it was dropped from the upward direction of the semiconductor light-emitting chip 4 so as to cover the chip 4 therewith.

In the samples of 48 pieces of the second comparative embodiment, the second comparative embodiment of 10 pieces spread under wet conditions toward the first resist layer 30 and spread out of the die-bonding pad 13 and the exposed connecting portion 16 as shown in FIG. 7a, which is the partial enlarged perspective view depicting the vicinity of the die-bonding pad 13 of the die-bonding portion 12 of the first conductor pattern 10. The semiconductor light-emitting chip 4 of one piece exposed the side surface portion 4E of the chip 4, in which each of opposite side surfaces and other opposite side surfaces is located in the opposite direction of the exposed connecting portion 16 and in the direction perpendicular to the opposite direction of the exposed connecting portion 16, respectively, from the first encapsulating material 6 as shown in FIG. 7b.

By contrast to the second comparative embodiment, in the second embodiment of samples of the same 48 pieces as the second comparative embodiment, the semiconductor light-emitting chip 4 of only one piece exposed a slightly side surface portion of the chip 4, in which each of the opposite side surfaces is located in the direction perpendicular to the opposite direction of the exposed connecting portion 16, from the first encapsulating material 6.

As the result of the evaluations, sources learned that the first encapsulating material 6 may be formed in a substantially fair dome shape at a high yield ration and a high repeatability so as to cover the semiconductor light-emitting chip 4 therewith using the potting method by forming the die-bonding portion 12 of the first conductor pattern 10, which includes the die-bonding pad 13 and each of the die-bonding projection pattern 15 and the exposed connecting portion 16 extending from the die-bonding pad 13 in a radial fashion having a substantially same interval and a substantially same dimension with respect to each other, even when the top surface 4T of the chip 4 is rectangular, and by moving a potting machine in the longitudinal direction of the chip 4 according to characteristics such as kinds, viscosity and the like of the first encapsulating material 6 in some cases.

Figure 8:
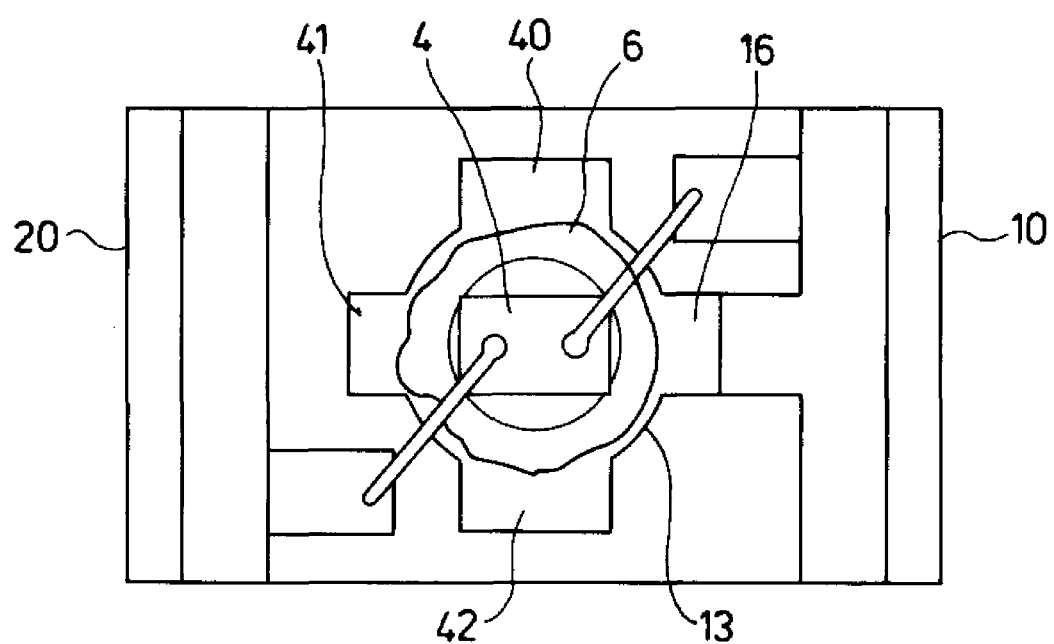
Figure 9A:
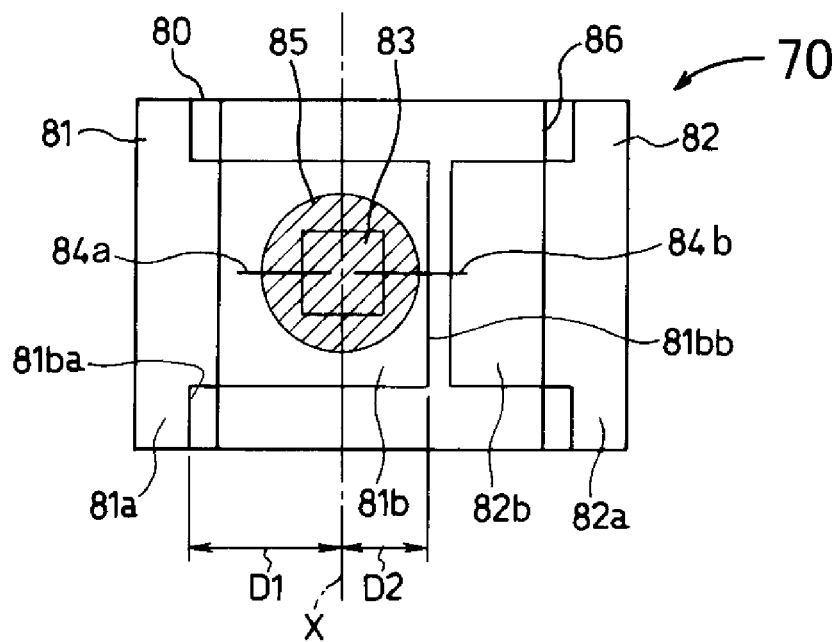
FIGS. 9a and 9b are an enlarged top view and an enlarged side cross-sectional view showing a first conventional semiconductor light-emitting device of surface mount type.
Figure 9B:
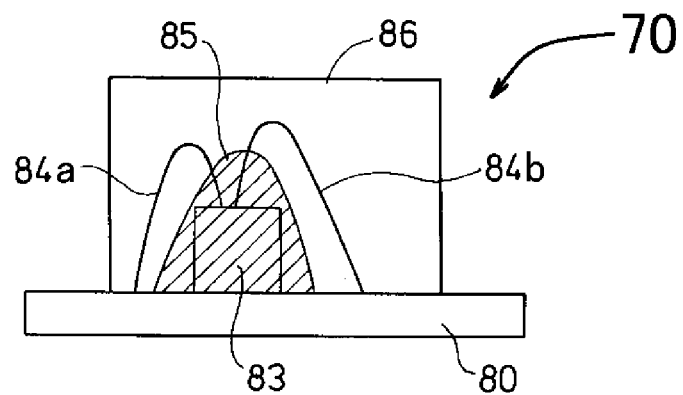
Figure 10:
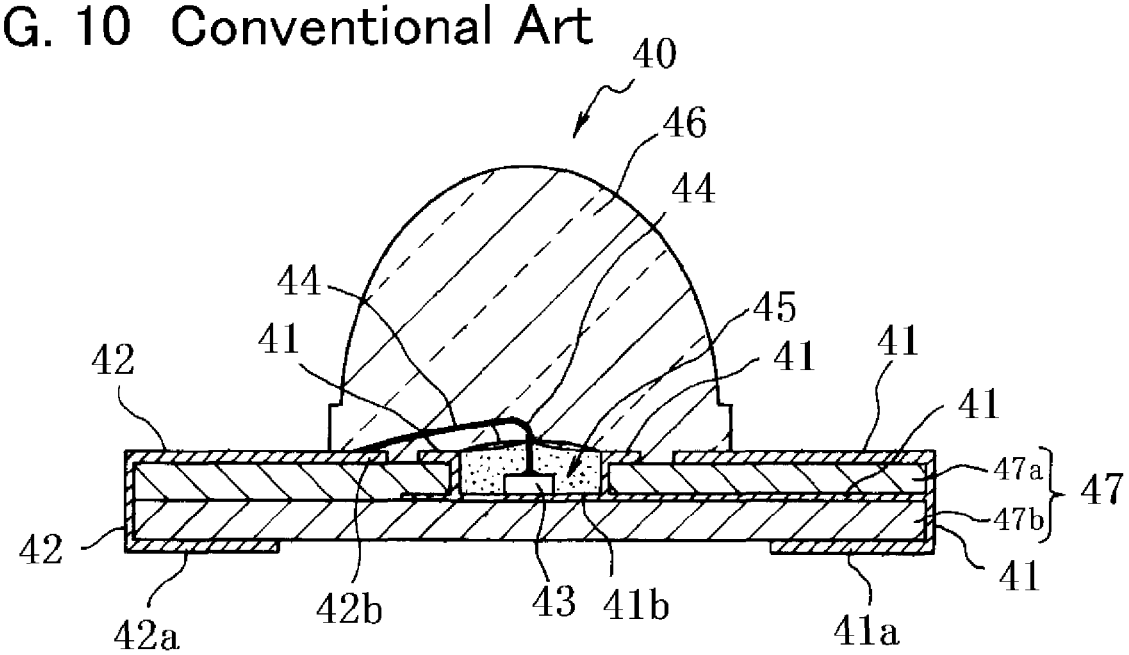
FIG. 10 is an enlarged side cross-sectional view depicting a second conventional semiconductor light-emitting device of surface mount type.

As an exemplary variation of the second embodiment, when the top surface 4T of the chip 4 is rectangular, the die-bonding portion 12 of the first conductor pattern 10 can include the die-bonding pad 13, which is formed in the substantially circular shape, and each of the first die-bonding projection pattern 40, the second die-bonding projection pattern 41, the third die-bonding projection pattern 42 and the exposed connecting portion 16, which extends from the die-bonding pad 13 in the radial fashion having a substantially same interval of 90 degrees and in which each width of the first die-bonding projection pattern 40 and the third die-bonding projection pattern 42 is wider than each width of the second die-bonding projection pattern 41 and the exposed connecting portion 15 so that each of the side surface in the longitudinal direction of the chip 4 faces a respective one of the first die-bonding projection pattern 40 and the third die-bonding projection pattern 42, as shown in FIG. 8.

Thereby, even when the semiconductor light-emitting chip 4 having the top surface 4T formed in the substantially rectangular shape is die-bonded on the die-bonding pad 13, the first encapsulating material 6 can be formed in a substantially fair dome shape at a high yield ration and a high repeatability by heat-solidifying the uncured first encapsulating resin. Therefore, even when the top surface 4T of the semiconductor light-emitting chip 4 is either one of the square shape or the rectangular shape and the two electrodes are located on the top surface 4T of the chip 4, the uncured first encapsulating resin can be dropped from the upward direction of the semiconductor light-emitting chip 4, and can cover the chip 4 and connecting portions between the first top electrode 4c1 of the chip 4 and the first bonding wire 5C1 and between the second top electrode 4c2 of the chip 4 and the second bonding wire 5C2 in a substantially fair dome shape.

In addition, when the semiconductor light-emitting chip 4 is die-bonded on the die-bonding pad 13, because each of the first die-bonding projection pattern 40, the second die-bonding projection pattern 41, the third die-bonding projection pattern 42 and the exposed connecting portion 16, which extends from the die-bonding pad 13 in the radial fashion having the substantially same interval of 90 degrees, can be used as a mark of a die-bonding position for the chip 4, a locating accuracy between the semiconductor light-emitting chip 4 and the die-bonding pad 13 with respect to the central point 13C of the die-bonding pad 13 can improve.

Moreover, when at least one of the first resist layer 30 and the second resist layer 31 is not provided, the exposed connecting portion 16 can be defined as a portion between the second apical end 13a2 of the die-bonding pad 13 and an end line of the first external electrode 11 on the top surface 2T of the circuit board 2, which extends along the first side surface 2S1 of the circuit board 2. The second wire bonding pad 22 can also be defined a portion between the first apical end 13a1 of the die-bonding pad 13 and an end line of the second external electrode 20 on the top surface 2T of the circuit board 2, which extends along the second side surface 2S2 of the circuit board 2.

As described above, the first encapsulating material 6 can be formed in the substantially fair dome shape at a high yield ration and a high repeatability so as to cover the semiconductor light-emitting chip 4 therewith using the potting method and the like by forming the die-bonding portion 12 of the first conductor pattern 10, which includes the die-bonding pad 13 to die-bond the semiconductor light-emitting chip 4 and each of the die-bonding projection pattern 15 and the exposed connecting portion 16 extending from the die-bonding pad 13 in the radial fashion having the substantially same interval and the substantially same dimension with respect to each other.

In addition, the first encapsulating material 6 can include the wavelength converting material 6a to wavelength-convert light emitted from the semiconductor light-emitting chip 4. Therefore, the disclosed subject matter can provide small semiconductor light-emitting devices with a simple structure, in which the semiconductor light-emitting chip 4 can be mounted on a circuit board without a laminate, and which can emit the mixture light having various color tones and the excellent optical characteristics by an additive color mixture of the excited light emitted from the wavelength converting material 6a and a part of light emitted from the semiconductor light-emitting chip 4.

Moreover, even when the top surface 4T of the chip 4 is formed in a substantially rectangular shape in addition to a square shape, the first encapsulating material 6 can be formed in the substantially fair dome shape at a high yield ration and a high repeatability so as to cover the semiconductor light-emitting chip 4 therewith. Furthermore, the locating accuracy between the semiconductor light-emitting chip 4 and the die-bonding pad 13 can improve as described above. Thus, the small semiconductor light-emitting devices can be used to illuminate goods laid out in a narrow show window, a vending machine and the like, and also can be used to illuminate letters and figures in a thin display for the vending machine and the like using various color lights by dispersing the wavelength converting material 6a in the first encapsulating material 6.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art and patent document references described above are hereby incorporated in their entirety by reference.

What is claimed is:

1. A semiconductor light-emitting device including an optical axis comprising:
   a circuit board having a top surface, a bottom surface, a first side surface and a second side surface located between the top surface and the bottom surface, and being formed in a substantially rectangular tabular shape, the first side surface and the second side surface located in an opposite direction with respect to each other;
   a first conductor pattern including a first external electrode, a first wire bonding pad and a die-bonding portion,
      the first external electrode extending from the top surface of the circuit board toward the bottom surface of the circuit board along a longitudinal direction of the circuit board via the first side surface of the circuit board, and
      the die-bonding portion having a die-bonding pad, at least one die-bonding pattern and a connecting pattern extending from the first external electrode toward a middle portion on the top surface of the circuit board along the longitudinal direction of the circuit board, the connecting pattern being electrically connected between the die-bonding pad and the first external electrode, the die-bonding pad having a central point and a plurality of apical ends formed in a substantially circular shape, the plurality of apical ends located on an outer circumference of the circular shape, and the at least one die-bonding pattern projecting from the outer circumference of the die-bonding pad in an outward direction of the die-bonding pad, wherein a respective one of the apical ends of the die-bonding pad is located in each of middle portions of circular connecting portions between the die-bonding pad and the connecting pattern and between the die-bonding pad and the at least one die-bonding pattern;
   a second conductor pattern including an second external electrode and a second wire bonding pad,
      the second external electrode extending from the top surface of the circuit board toward the bottom surface of the circuit board along the longitudinal direction of the circuit board via the second side surface of the circuit board,
      the second wire bonding pad projecting from the second external electrode toward the first conductor pattern along the longitudinal direction on the top surface of the circuit board;
   a semiconductor light-emitting chip having a top surface, a bottom surface, a first electrode and a second electrode mounted on the die-bonding pad of the die-bonding portion of the first conductor pattern, the top surface of the semiconductor light-emitting chip having a substantially center formed in either a substantially square shape or a substantially rectangular shape, the center of the top surface of the semiconductor light-emitting chip being located over the central point of the die-bonding pad of the first conductor pattern, the first electrode of the semiconductor light-emitting chip formed either on the top surface of the chip or underneath the bottom surface of the chip, the second electrode of the semiconductor light-emitting chip formed on the top surface of the semiconductor light-emitting chip and being electrically connected to the second wire bonding pad of the second conductor pattern via a bonding wire;
   a first encapsulating material encapsulating the semiconductor light-emitting chip and a part of the bonding wire in a dome shape on the top surface of the circuit board;
   a second encapsulating resin covering at least the first encapsulating material and another part of the bonding wire exposed from the first encapsulating material; and
   wherein each of angles between adjacent lines connecting the central point of the die-bonding pad to the plurality of apical ends of the die-bonding pad forms substantially a same angle.

2. The semiconductor light-emitting device according to claim 1,
   wherein the first wire bonding pad projects from the first external electrode of the first conductor pattern toward the second conductor pattern along the longitudinal direction on the top surface of the circuit board, and being located in an opposite direction of the second wire bonding pad of the second conductor pattern with respect to the die-bonding portion of the first conductor pattern, and
   wherein the first electrode of the semiconductor light-emitting chip is formed on the top surface of the chip, and the first electrode of the chip is electrically connected to the first wire bonding pad of the first conductor pattern via another bonding wire.

3. The semiconductor light-emitting device according to claim 1, further comprising:
   a first resist layer formed on the first external electrode and a part of the connecting pattern of the first conductor pattern, and thereby the connecting pattern forming an exposed connecting pattern, which is exposed from the first resist layer, and a part of the first resist layer being located between at least the first external electrode of the first conductor pattern and the second encapsulating resin; and
   a second resist layer formed on the second external electrode of the second conductor pattern, and a part of the second resist layer being located between the second external electrode and the second encapsulating resin.

4. The semiconductor light-emitting device according to claim 3, wherein
   the at least one die-bonding pattern is odd, and the die-bonding pattern facing the exposed connecting pattern is formed in a substantially same dimension as the exposed connecting pattern symmetrically with reference to the central point of the die-bonding pad.

5. The semiconductor light-emitting device according to claim 1, wherein
   the at least one die-bonding pattern is odd, and the die-bonding pattern facing the connecting pattern is formed in a substantially same dimension as the connecting pattern symmetrically with reference to the central point of the die-bonding pad.

6. The semiconductor light-emitting device according to claim 1, wherein
   the top surface of the semiconductor light-emitting chip is formed in the substantially rectangular shape, the at least one die-bonding pattern is odd, and each of side surfaces of the longitudinal direction of the top surface of the semiconductor light-emitting chip faces the connecting pattern and the die-bonding pattern facing the connecting pattern via the chip, respectively.

7. The semiconductor light-emitting device according to claim 3, wherein
the top surface of the semiconductor light-emitting chip is formed in the substantially rectangular shape, the at least one die-bonding pattern is odd, and each of side surfaces of the longitudinal direction of the top surface of the semiconductor light-emitting chip faces the exposed connecting pattern and the die-bonding pattern facing the exposed connecting pattern via the chip, respectively.

8. The semiconductor light-emitting device according to claim 1, wherein the first encapsulating material includes at least one of a yellow phosphor, a red phosphor, a green phosphor and a blue phosphor.

9. The semiconductor light-emitting device according to claim 1, wherein the semiconductor light-emitting chip is a blue light-emitting diode, which emits blue light, and the first encapsulating material includes at least one of a yellow phosphor, a red phosphor and a green phosphor.

10. The semiconductor light-emitting device according to claim 1, wherein the semiconductor light-emitting chip is a light-emitting diode, which emits ultraviolet light, and the first encapsulating material includes at least one of a red phosphor, a green phosphor and a blue phosphor.

11. The semiconductor light-emitting device according to claim 1,
wherein the first wire bonding pad projects from the first external electrode of the first conductor pattern toward the second conductor pattern along the longitudinal direction on the top surface of the circuit board, and being located in an opposite direction of the second wire bonding pad of the second conductor pattern with respect to the die-bonding portion of the first conductor pattern, and
wherein the first electrode of the semiconductor light-emitting chip is formed underneath the bottom surface of the chip, and the first electrode of the chip is electrically connected to the die-bonding pad of the first conductor pattern via a conductive adhesive material and the semiconductor light-emitting chip is die-bonded on the die-bonding pad of the first conductor pattern via the conductive adhesive material.

12. The semiconductor light-emitting device according to claim 3, wherein
the at least one die-bonding pattern is even, and each of the at least one die-bonding pattern is formed in a substantially same dimension as the exposed connecting pattern with reference to a direction of the central point of the die-bonding first wire bonding pad.

13. The semiconductor light-emitting device according to claim 1, wherein
the at least one die-bonding pattern is even, and each of the at least one die-bonding pattern is formed in a substantially same dimension as the connecting pattern with reference to a direction of the central point of the die-bonding pattern.

* * * * *